(12) United States Patent
Yoshida (10) Patent No.: US 12,170,211 B2
(45) Date of Patent: Dec. 17, 2024

(54) LASER PROCESSING APPARATUS

(71) Applicant: DISCO CORPORATION, Tokyo (JP)

(72) Inventor: Yuta Yoshida, Tokyo (JP)

(73) Assignee: DISCO CORPORATION, Tokyo (JP)

(*) Notice: Subject to any disclaimer, the term of this patent is extended or adjusted under 35 U.S.C. 154(b) by 776 days.

(21) Appl. No.: 17/122,060

(22) Filed: Dec. 15, 2020

(65) Prior Publication Data

US 2021/0202278 A1 Jul. 1, 2021

(30) Foreign Application Priority Data

Dec. 26, 2019 (JP) ................................. 2019-237460

(51) Int. Cl.
*H01L 21/67* (2006.01)
*B23K 26/06* (2014.01)
(Continued)

(52) U.S. Cl.
CPC .... *H01L 21/67092* (2013.01); *B23K 26/0648* (2013.01); *B23K 26/073* (2013.01); *B23K 26/0853* (2013.01); *B23K 26/364* (2015.10); *G02B 19/0009* (2013.01); *G02B 19/0047* (2013.01); *G02B 27/0927* (2013.01); *G02B 27/0966* (2013.01); *H01L 21/67115* (2013.01); *H01L 21/68764* (2013.01); *B23K 26/0665* (2013.01)

(58) Field of Classification Search
None
See application file for complete search history.

(56) References Cited

U.S. PATENT DOCUMENTS 4,203,652 A * 5/1980 Hanada .............. G02B 19/0014
372/101
5,095,386 A * 3/1992 Scheibengraber ..........................
G02B 27/0911
359/710

(Continued)

FOREIGN PATENT DOCUMENTS

CN 107866639 A * 4/2018 ......... B23K 26/0648
CN 105527716 B * 9/2018 ......... G02B 27/0905
(Continued)

OTHER PUBLICATIONS

Translation of CN-107866639-A (Year: 2018).*
(Continued)

*Primary Examiner* — Elizabeth M Kerr
(74) *Attorney, Agent, or Firm* — GREER BURNS & CRAIN, LTD.

(57) ABSTRACT

A laser processing apparatus includes an energy distribution correcting unit that forms skirt parts of a Gaussian distribution of an energy distribution in a Y-axis direction regarding a laser beam emitted from a laser oscillator into a perpendicular distribution, an imaging lens group composed of two or more lenses that form an image of the beam shape of the laser beam for which the energy distribution has been corrected by the energy distribution correcting unit on the upper surface of the workpiece, and one cylindrical lens that adjusts the energy density in an X-axis direction regarding the laser beam for which the energy distribution has been corrected by the energy distribution correcting unit.

19 Claims, 6 Drawing Sheets

(51) Int. Cl.

| | |
|---|---|
| *B23K 26/073* | (2006.01) |
| *B23K 26/08* | (2014.01) |
| *B23K 26/364* | (2014.01) |
| *G02B 19/00* | (2006.01) |
| *G02B 27/09* | (2006.01) |
| *H01L 21/687* | (2006.01) |

(56) References Cited

U.S. PATENT DOCUMENTS

| | | | | |
|---|---|---|---|---|
| 5,684,642 | A * | 11/1997 | Zumoto | B23K 26/066 385/38 |
| 6,097,420 | A * | 8/2000 | Baba | G02B 27/0988 347/241 |
| 2017/0066079 | A1 * | 3/2017 | Reisse | B23K 26/127 |
| 2019/0351511 | A1 * | 11/2019 | Ryu | B23K 26/064 |

FOREIGN PATENT DOCUMENTS

| | | | | | |
|---|---|---|---|---|---|
| CN | 108941896 | A | * | 12/2018 | B23K 26/046 |
| JP | 2010158710 | A | * | 7/2010 | |
| WO | WO-2015014100 | A1 | * | 2/2015 | G02B 27/01 |

OTHER PUBLICATIONS

Translation of JP-2010158710-A (Year: 2010).*
Translation of CN-108941896-A (Year: 2018).*
Translation of CN-105527716-B (Year: 2018).*
Translation of WO-2015014100-A1 (Year: 2015).*

* cited by examiner

LASER PROCESSING APPARATUS

BACKGROUND OF THE INVENTION

Field of the Invention

The present invention relates to a laser processing apparatus.

Description of the Related Art

A laser processing apparatus that irradiates a workpiece such as a semiconductor wafer with a laser beam and forms dividing grooves in order to process the workpiece is known. In such a laser processing apparatus, various parts such as a mask, a relay lens, and a cylindrical lens pair are incorporated in an optical system (refer to Japanese Patent Laid-open No. 2010-158710).

SUMMARY OF THE INVENTION

Incidentally, there is a problem that adjustment of the above-described parts involves very high difficulty and takes a long time. In particular, the cylindrical lens pair involves difficulty in adjustment of the generatrix, which is a cause of yielding machine difference between processing apparatuses. Therefore, studies have been made on making the adjustment easy by reducing the number of cylindrical lenses from two to one. However, there are problems that the movement distance of the cylindrical lens becomes long at the time of adjustment, which makes it difficult to keep the mechanical accuracy, and that the apparatus size is enlarged.

Thus, an object of the present invention is to provide a laser processing apparatus that can easily adjust the spot shape of a laser beam on the upper surface of a workpiece without enlarging the apparatus size.

In accordance with an aspect of the present invention, there is provided a laser processing apparatus including a chuck table that holds a workpiece, a laser beam irradiation unit that irradiates the workpiece held by the chuck table with a laser beam with a wavelength having absorbability with respect to the workpiece, an X-axis direction movement unit that moves the chuck table and the laser beam irradiation unit relatively in an X-axis direction that is a processing feed direction, and a Y-axis direction movement unit that moves the chuck table and the laser beam irradiation unit relatively in a Y-axis direction that is an indexing feed direction orthogonal to the processing feed direction. The laser beam irradiation unit includes a laser oscillator, a condensing lens that condenses the laser beam emitted from the laser oscillator, and an energy distribution correcting unit that is disposed between the laser oscillator and the condensing lens and forms skirt parts of a Gaussian distribution of an energy distribution in the Y-axis direction regarding the laser beam emitted from the laser oscillator into a perpendicular distribution. The laser beam irradiation unit includes also an imaging lens group composed of two or more lenses that form an image of a beam shape of the laser beam for which the energy distribution has been corrected by the energy distribution correcting unit on an upper surface of the workpiece and one cylindrical lens that adjusts energy density in the X-axis direction regarding the laser beam for which the energy distribution has been corrected by the energy distribution correcting unit. A distance between the imaging lens group and the cylindrical lens is relatively moved to adjust a spot shape of the laser beam on the upper surface of the workpiece.

Preferably, the imaging lens group includes a relay lens and an expander.

According to the invention of the present application, the spot shape of a laser beam on the upper surface of a workpiece can be easily adjusted without enlarging the apparatus size.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by content described in the following embodiment. Furthermore, what can be easily envisaged by those skilled in the art and what are substantially the same are included in constituent elements described below. Moreover, configurations described below can be combined as appropriate. In addition, various kinds of omission, replacement, or change of a configuration can be executed without departing from the gist of the present invention.

Figure 1:
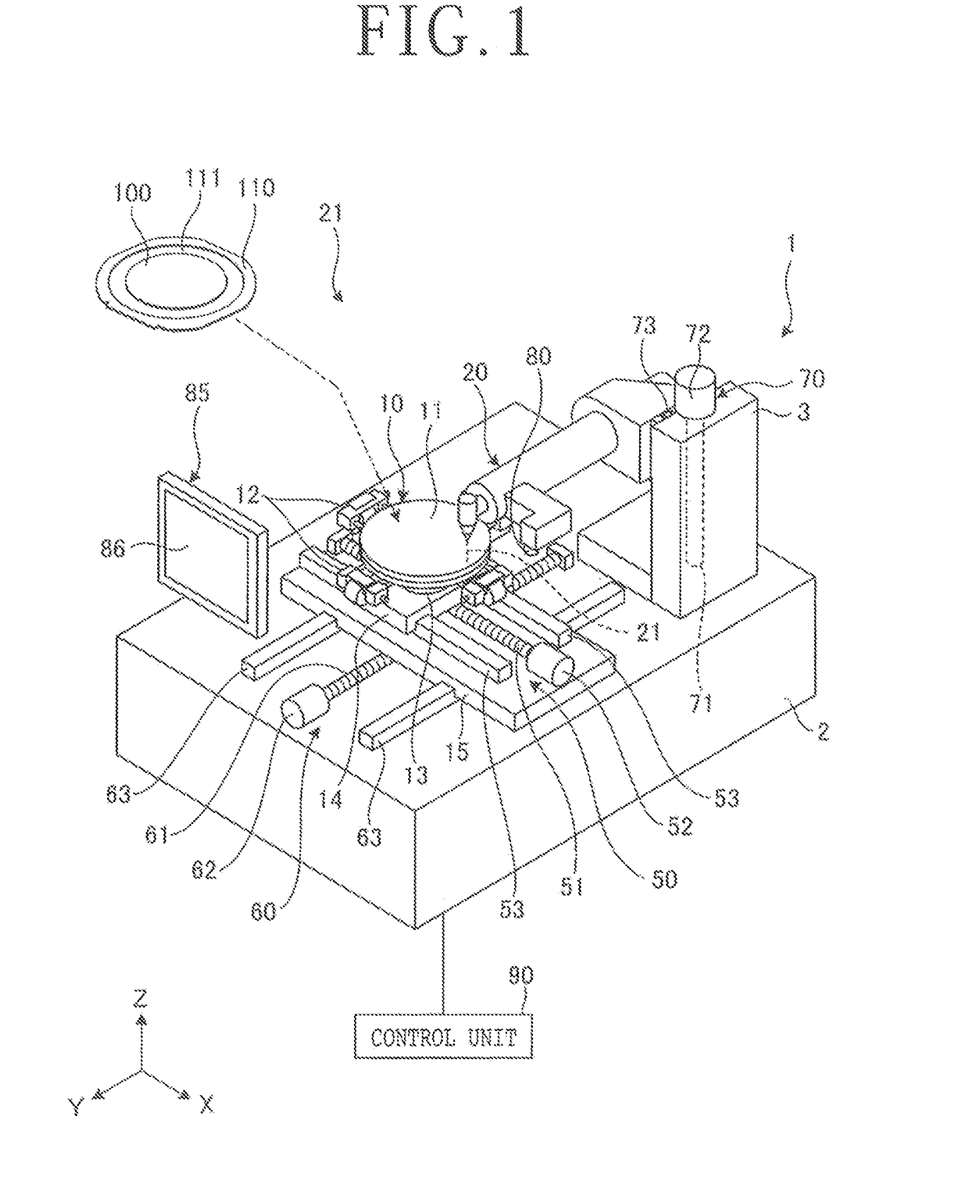
FIG. 1 is a perspective view illustrating a configuration example of a laser processing apparatus according to an embodiment.
Figure 2:
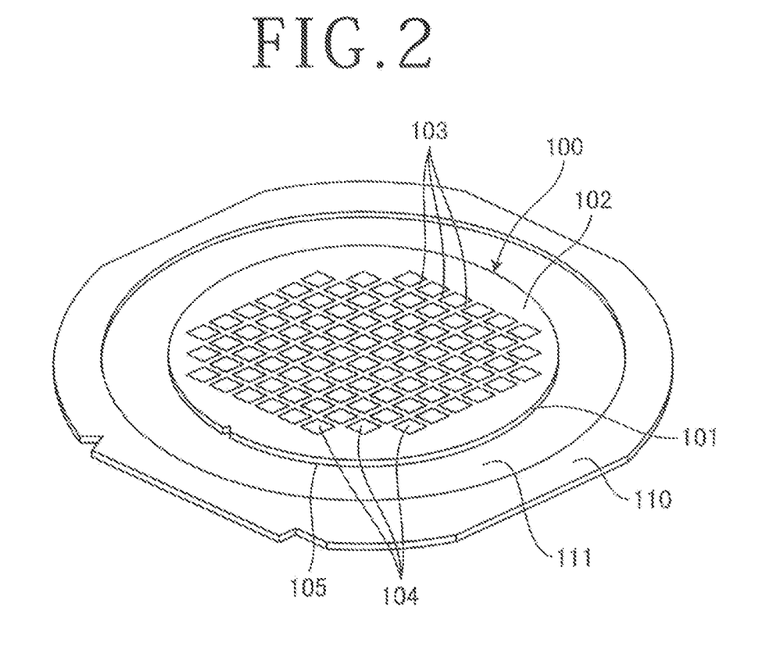
FIG. 2 is a perspective view of a workpiece of a processing target of the laser processing apparatus illustrated in FIG. 1.

A laser processing apparatus 1 according to the embodiment of the present invention will be described based on the drawings. FIG. 1 is a perspective view illustrating a configuration example of the laser processing apparatus 1 according to the embodiment. FIG. 2 is a perspective view of a workpiece 100 of a processing target of the laser processing apparatus 1 illustrated in FIG. 1.

As illustrated in FIG. 1, the laser processing apparatus 1 includes a chuck table 10, a laser beam irradiation unit 20, an X-axis direction movement unit 50, a Y-axis direction movement unit 60, a Z-axis direction movement unit 70, an imaging unit 80, a display unit 85, and a control unit 90. In the following description, an X-axis direction is one direction in a horizontal plane. A Y-axis direction is the direction orthogonal to the X-axis direction in the horizontal plane. A Z-axis direction is the direction orthogonal to the X-axis direction and the Y-axis direction. In the laser processing apparatus 1 of the embodiment, the processing feed direction is the X-axis direction and the indexing feed direction is the Y-axis direction.

The laser processing apparatus 1 according to the embodiment is an apparatus that forms a laser processed groove 106 (see FIG. 5) in the workpiece 100 by irradiating the workpiece 100 that is a processing target with a laser beam 21. In the embodiment, a configuration in which groove processing is executed for the workpiece 100 will be described. However, it is also possible to execute perforation processing for the workpiece 100. The workpiece 100 is a wafer such as a circular-plate-shaped semiconductor wafer or an optical device wafer including silicon (Si), sapphire ($Al_2O_3$), gallium arsenide (GaAs), silicon carbide (SiC), or the like as a substrate 101.

As illustrated in FIG. 2, the workpiece 100 has planned dividing lines 103 set in a lattice manner in a front surface 102 of the substrate 101 and devices 104 formed in regions marked out by the planned dividing lines 103. For example, the device 104 is a circuit such as an integrated circuit (IC) or a large scale integration (LSI) or an image sensor of a charge coupled device (CCD), a complementary metal oxide semiconductor (CMOS), or the like. In the embodiment, the laser processed grooves 106 (see FIG. 5) are formed along the planned dividing lines 103 in the workpiece 100. In the embodiment, for the workpiece 100, a tape 111 to which an annular frame 110 is stuck and that has a larger diameter than the outer diameter of the workpiece 100 is stuck to a back surface 105 on the back side of the front surface 102, and the workpiece 100 is supported in an opening of the annular frame 110.

As illustrated in FIG. 1, the chuck table 10 holds the workpiece 100 by a holding surface 11. The holding surface 11 is formed from porous ceramic or the like and has a circular disc shape. The holding surface 11 has a flat surface parallel to the horizontal direction in the embodiment. The holding surface 11 is connected to a vacuum suction source through a vacuum suction path, for example. The chuck table 10 sucks and holds the workpiece 100 placed on the holding surface 11. Plural clamp parts 12 that clamp the annular frame 110 supporting the workpiece 100 are disposed around the chuck table 10. The chuck table 10 is rotated around the axis center parallel to the Z-axis direction by a rotation unit 13. The rotation unit 13 is supported by an X-axis direction moving plate 14. The rotation unit 13 and the chuck table 10 are moved in the X-axis direction by the X-axis direction movement unit 50 through the X-axis direction moving plate 14. The rotation unit 13 and the chuck table 10 are moved in the Y-axis direction by the Y-axis direction movement unit 60 through the X-axis direction moving plate 14, the X-axis direction movement unit 50, and a Y-axis direction moving plate 15.

The laser beam irradiation unit 20 is a unit that irradiates the workpiece 100 held by the chuck table 10 with the pulsed laser beam 21. At least a condensing lens 26 in the laser beam irradiation unit 20 is supported by the Z-axis direction movement unit 70 set on a column 3 disposed upright from an apparatus main body 2 of the laser processing apparatus 1. The detailed configuration of the laser beam irradiation unit 20 will be described later.

The X-axis direction movement unit 50 is a unit that moves the chuck table 10 and the laser beam irradiation unit 20 relatively in the X-axis direction, which is the processing feed direction. The X-axis direction movement unit 50 moves the chuck table 10 in the X-axis direction in the embodiment. The X-axis direction movement unit 50 is set over the apparatus main body 2 of the laser processing apparatus 1 in the embodiment. The X-axis direction movement unit 50 supports the X-axis direction moving plate 14 movably in the X-axis direction. The X-axis direction movement unit 50 includes a well-known ball screw 51, a well-known pulse motor 52, and well-known guide rails 53. The ball screw 51 is disposed rotatably around the axis center. The pulse motor 52 rotates the ball screw 51 around the axis center. The guide rails 53 support the X-axis direction moving plate 14 movably in the X-axis direction. The guide rails 53 are disposed in such a manner as to be fixed to the Y-axis direction moving plate 15.

The Y-axis direction movement unit 60 is a unit that moves the chuck table 10 and the laser beam irradiation unit 20 relatively in the Y-axis direction, which is the indexing feed direction. The Y-axis direction movement unit 60 moves the chuck table 10 in the Y-axis direction in the embodiment. The Y-axis direction movement unit 60 is set on the apparatus main body 2 of the laser processing apparatus 1 in the embodiment. The Y-axis direction movement unit 60 supports the Y-axis direction moving plate 15 movably in the Y-axis direction. The Y-axis direction movement unit 60 includes a well-known ball screw 61, a well-known pulse motor 62, and well-known guide rails 63. The ball screw 61 is disposed rotatably around the axis center. The pulse motor 62 rotates the ball screw 61 around the axis center. The guide rails 63 support the Y-axis direction moving plate 15 movably in the Y-axis direction. The guide rails 63 are disposed in such a manner as to be fixed to the apparatus main body 2.

The Z-axis direction movement unit 70 is a unit that moves the chuck table 10 and the laser beam irradiation unit 20 relatively in the Z-axis direction, which is a focal point position adjustment direction. The Z-axis direction movement unit 70 moves the laser beam irradiation unit 20 in the Z-axis direction in the embodiment. The Z-axis direction movement unit 70 is set on the column 3 disposed upright from the apparatus main body 2 of the laser processing apparatus 1 in the embodiment. The Z-axis direction movement unit 70 supports at least the condensing lens 26 (see FIG. 3) in the laser beam irradiation unit 20 movably in the Z-axis direction. The Z-axis direction movement unit 70 includes a well-known ball screw 71, a well-known pulse motor 72, and a well-known guide rail 73. The ball screw 71 is disposed rotatably around the axis center. The pulse motor 72 rotates the ball screw 71 around the axis center. The guide rail 73 supports the laser beam irradiation unit 20 movably in the Z-axis direction. The guide rail 73 is disposed in such a manner as to be fixed to the column 3.

The imaging unit 80 images the workpiece 100 held by the chuck table 10. The imaging unit 80 includes a charge coupled device (CCD) camera or infrared camera that images the workpiece 100 held by the chuck table 10. The imaging unit 80 is fixed to be adjacent to the condensing lens 26 (see FIG. 3) of the laser beam irradiation unit 20, for example. The imaging unit 80 images the workpiece 100 and obtains an image for fulfilling alignment in which position adjustment between the workpiece 100 and the laser beam irradiation unit 20 is executed. Then, the imaging unit 80 outputs the obtained image to the control unit 90.

The display unit 85 includes a display surface 86 that displays the state of processing operation, an image, or the like. The display unit 85 is a display part configured by a liquid crystal display device or the like. If the display surface 86 includes a touch panel, the display unit 85 may include an input part. The input part can accept various kinds of operation, such as registration of information regarding the content of processing by an operator. The input part may be an external input device such as a keyboard. In the display unit 85, information or an image displayed by the display surface 86 is switched by operation from the input part or the like. The display unit 85 may include an informing part. The informing part issues at least one of sound and light and informs the operator of the laser processing apparatus 1 of predefined informing information. The informing part may be an external informing device such as a speaker or a light emitting device. The display unit 85 is connected to the control unit 90.

The control unit 90 controls each of the above-described respective constituent elements of the laser processing apparatus 1 and causes the laser processing apparatus 1 to execute processing operation on the workpiece 100. The control unit 90 controls the laser beam irradiation unit 20, the X-axis direction movement unit 50, the Y-axis direction movement unit 60, the Z-axis direction movement unit 70, the imaging unit 80, and the display unit 85. The control unit 90 is a computer that includes an arithmetic processing device as arithmetic operation means, a storing device as storing means, and an input-output interface device as communication means. The arithmetic processing device includes a microprocessor such as a central processing unit (CPU), for example. The storing device has a memory such as a read only memory (ROM) or a random access memory (RAM). The arithmetic processing device executes various kinds of arithmetic operation on the basis of a predetermined program stored in the storing device. According to an arithmetic operation result, the arithmetic processing device outputs various control signals to the above-described respective constituent elements through the input-output interface device and executes control of the laser processing apparatus 1.

The control unit 90 causes the imaging unit 80 to image the workpiece 100, for example. The control unit 90 executes image processing of an image obtained by imaging by the imaging unit 80, for example. The control unit 90 detects a processing line of the workpiece 100 by the image processing, for example. For example, the control unit 90 causes the X-axis direction movement unit 50 to be driven in such a manner that a focal spot 27 of the laser beam 21 moves along the processing line. In addition, the control unit 90 causes the laser beam irradiation unit 20 to execute irradiation with the laser beam 21.

Figure 3:
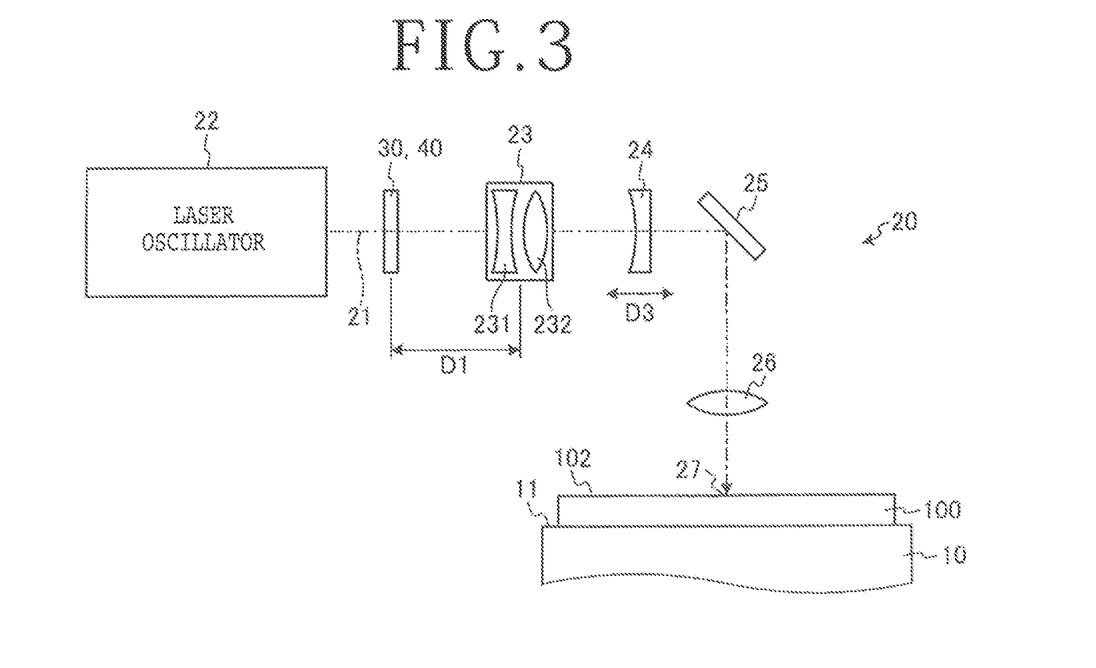
FIG. 3 is a schematic diagram schematically illustrating the configuration of a laser beam irradiation unit of the laser processing apparatus illustrated in FIG. 1.

Next, the laser beam irradiation unit 20 will be described in detail. FIG. 3 is a schematic diagram schematically illustrating the configuration of the laser beam irradiation unit 20 of the laser processing apparatus 1 illustrated in FIG. 1. As illustrated in FIG. 3, the laser beam irradiation unit 20 includes a laser oscillator 22, an energy distribution correcting unit 30 or 40, an imaging lens group 23, a cylindrical lens 24, a mirror 25, and the condensing lens 26.

The laser oscillator 22 emits the laser beam 21 having a predetermined wavelength for processing the workpiece 100. The laser beam 21 with which irradiation is executed by the laser beam irradiation unit 20 has a wavelength having absorbability with respect to the workpiece 100. The beam diameter of the laser beam 21 is 1 mm, for example.

The energy distribution correcting unit 30 or 40 is disposed between the laser oscillator 22 and the condensing lens 26. In the embodiment, the energy distribution correcting unit 30 or 40 is disposed between the laser oscillator 22 and the imaging lens group 23. The energy distribution correcting units 30 and 40 each include a mask that is disposed at a predetermined position on the optical path of the laser beam 21 and forms the beam shape into a predetermined shape by blocking part of the laser beam 21.

Figure 4:
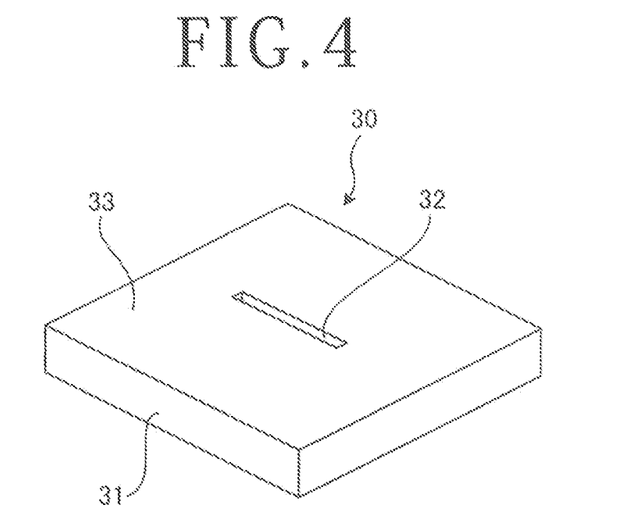
FIG. 4 is a perspective view illustrating one example of an energy distribution correcting unit according to the embodiment.
Figure 5:
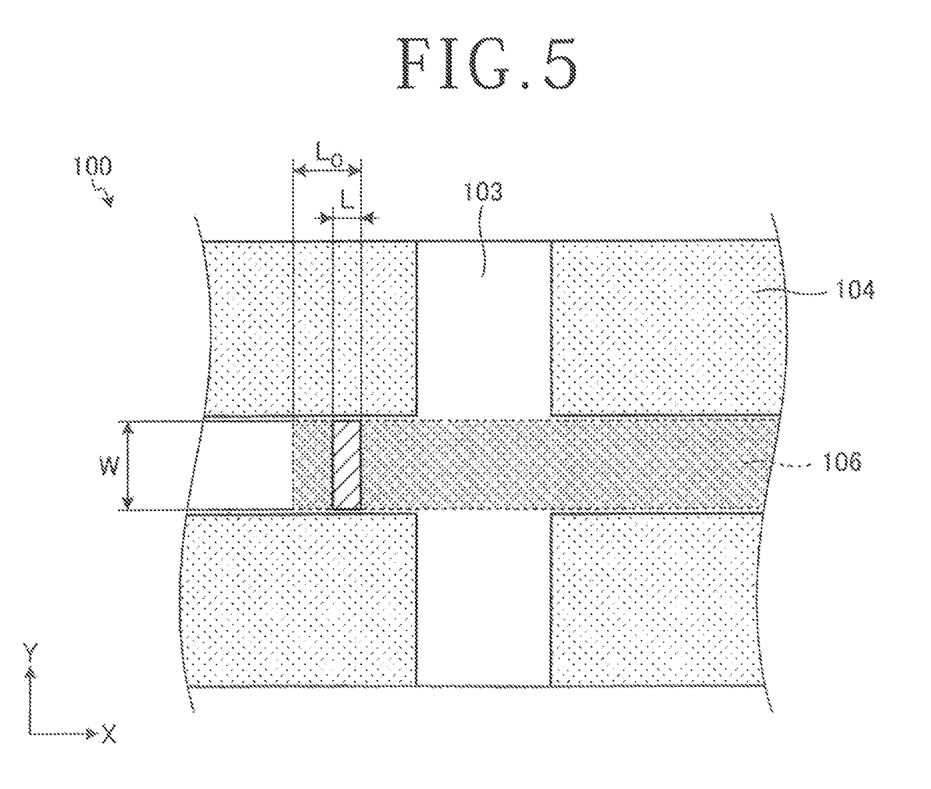
FIG. 5 is a schematic diagram illustrating one example of a beam shape at a focal spot.

FIG. 4 is a perspective view illustrating one example of the energy distribution correcting unit 30 according to the embodiment. FIG. 5 is a schematic diagram illustrating one example of the beam shape at the focal spot 27. As illustrated in FIG. 4, the energy distribution correcting unit 30 includes a mask base 31, a transmission part 32, and a light blocking part 33. The mask base 31 has a plate shape capable of blocking the laser beam 21. The mask base 31 is disposed at a predetermined position on the optical path of the laser beam 21. The transmission part 32 is a hole formed in the mask base 31. The transmission part 32 is a part through which the laser beam 21 is transmitted. The transmission part 32 has a slit shape with a slit width of 0.5 mm in the embodiment. The light blocking part 33 is a part that surrounds the transmission part 32 and blocks part of the laser beam 21. Part of the laser beam 21 with which the mask base 31 is irradiated is blocked by the light blocking part 33, and the remaining part passes through the transmission part 32. Due to this, the energy distribution correcting unit 30 forms the beam shape in the Y-axis direction at the focal spot 27 of the laser beam 21 illustrated in FIG. 5. The processing width of the laser processed groove 106 is decided based on a focal spot width W in the Y-axis direction at the focal spot 27.

Figure 6:
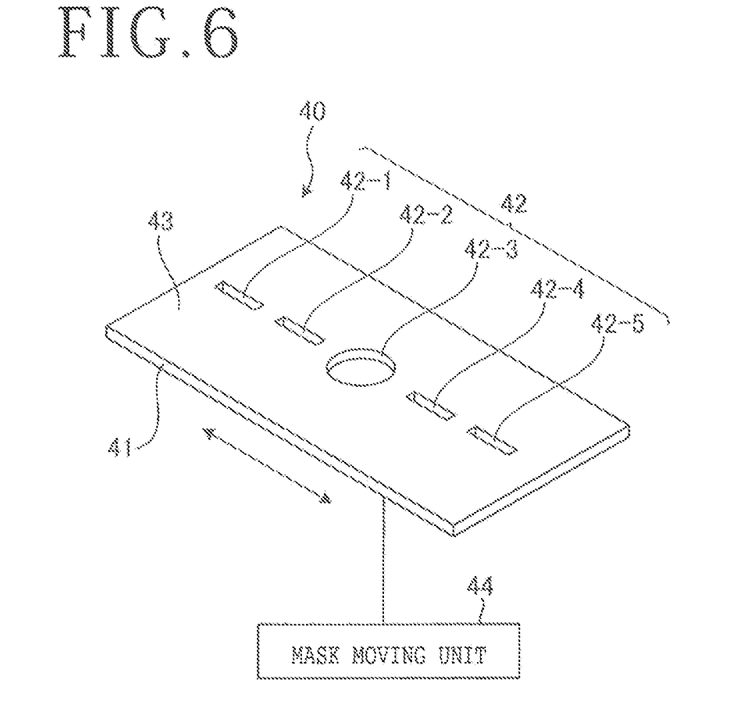
FIG. 6 is a perspective view illustrating another example of the energy distribution correcting unit according to the embodiment.

FIG. 6 is a perspective view illustrating one example of the energy distribution correcting unit 40 according to the embodiment. As illustrated in FIG. 6, the energy distribution correcting unit 40 includes a mask base 41, plural transmission parts 42, and a light blocking part 43. The mask base 41 has a plate shape capable of blocking the laser beam 21. The mask base 41 is disposed at a predetermined position on the optical path of the laser beam 21 similarly to the mask base 31 of the one example illustrated in FIG. 4. The transmission parts 42 are holes formed in the mask base 41. The transmission parts 42 are parts through which the laser beam 21 is transmitted. The light blocking part 43 is a part that surrounds the transmission parts 42 and blocks part of the laser beam 21. Part of the laser beam 21 with which any hole of the transmission parts 42 of the mask base 41 is irradiated is blocked by the light blocking part 43, and the remaining part passes through the transmission part 42.

The transmission parts 42 include five transmission parts 42-1, 42-2, 42-3, 42-4, and 42-5. The transmission part 42-3 is a hole with a circular shape. The transmission parts 42-1, 42-2, 42-4, and 42-5 are holes with a slit shape. The transmission part 42-3 allows the laser beam 21 to pass through it without blocking the laser beam 21. The transmission parts 42-1, 42-2, 42-4, and 42-5 block part of the laser beam 21. The transmission parts 42-1, 42-2, 42-4, and 42-5 have slit widths different from each other. The slit width of the transmission part 42-1 is smaller than that of the transmission part 42-2. The slit width of the transmission part 42-2 is smaller than that of the transmission part 42-4. The slit width of the transmission part 42-4 is smaller than that of the transmission part 42-5. That is, in the transmission parts 42-1, 42-2, 42-4, and 42-5, the slit width of the transmission part 42-1 is the smallest, and the slit width of the transmission part 42-5 is the largest. When the slit width is smaller, the passage rate of the laser beam 21 becomes lower. The beam shape in the Y-axis direction at the focal spot 27 of the laser beam 21 illustrated in FIG. 5 is changed corresponding to the slit width of the transmission part 42. That is, the processing width of the laser processed groove 106 is changed corresponding to the slit width of the transmission part 42.

The energy distribution correcting unit 40 is configured to be capable of moving in directions orthogonal to the optical axis of the laser beam 21 by a mask moving unit 44. The mask moving unit 44 includes a micrometer and an electric motor or the like, for example. The mask moving unit 44 is controlled by the control unit 90 illustrated in FIG. 1. For example, when predetermined operation is accepted from the input part or the like, the mask moving unit 44 moves the energy distribution correcting unit 40 in such a manner that the predetermined transmission part 42 of the energy distribution correcting unit 40 is located on the optical path of the laser beam 21. For example, when an operator selects the transmission part 42-1 through the input part or the like, the mask moving unit 44 moves the energy distribution correcting unit 40 in such a manner that the transmission part 42-1 is located on the optical path of the laser beam 21.

Figure 7:
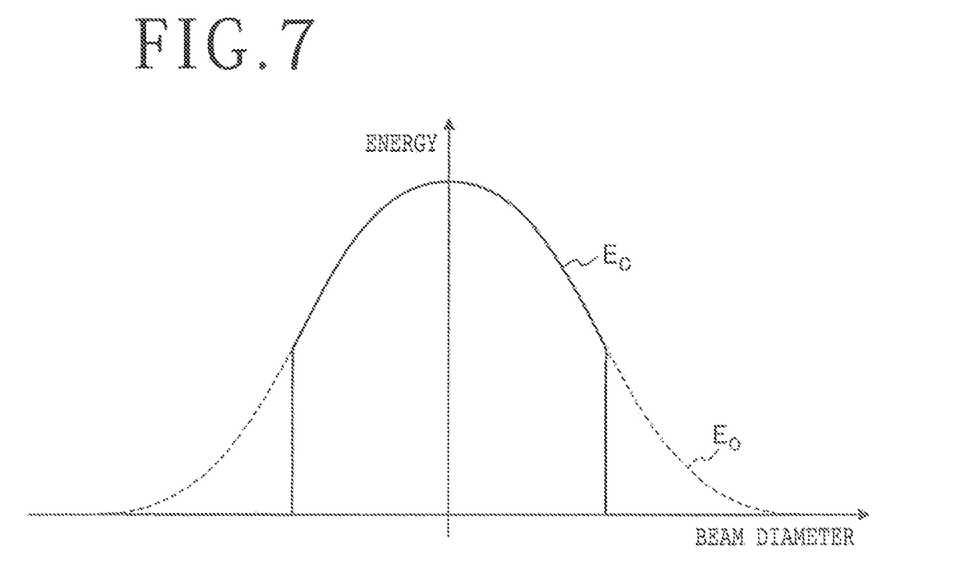
FIG. 7 is a graph illustrating one example of energy distributions of a laser beam in a Y-axis direction.

FIG. 7 is a graph illustrating one example of the distributions of energy $E_O$ and energy $E_C$ of the laser beam 21 in the Y-axis direction. As illustrated in FIG. 7, the distribution of the energy $E_O$ in the Y-axis direction orthogonal to the optical axis of the laser beam 21 emitted from the laser oscillator 22 becomes a Gaussian distribution. In the energy $E_C$ in the Y-axis direction regarding the laser beam 21 that has passed through the energy distribution correcting unit 30 or 40, parts equivalent to skirt parts of the Gaussian distribution of the energy $E_O$ become 0 due to blocking of the laser beam 21 by the light blocking part 33 or 43. That is, the energy distribution correcting unit 30 or 40 allows the central part with strong energy in the laser beam 21 to be transmitted by the transmission part 32 or 42 and blocks the end parts with weak energy by the light blocking part 33 or 43. Thereby, the energy distribution correcting unit 30 or 40 forms the skirt parts of the Gaussian distribution of the distribution of the energy $E_C$ of the laser beam 21 in the Y-axis direction into a substantially perpendicular distribution.

As above, the expression in the present invention that the skirt parts of the Gaussian distribution of the energy distribution in the Y-axis direction regarding the laser beam 21 emitted from the laser oscillator 22 into a perpendicular distribution means that the transmission part 32 or 42 of the energy distribution correcting unit 30 or 40 allows the central part in the Y-axis direction in the laser beam 21 emitted from the laser oscillator 22 to be transmitted and the light blocking part 33 or 43 blocks the end parts of the laser beam 21 in the Y-axis direction and the skirt parts of the Gaussian distribution of the distribution of the energy $E_C$ of the laser beam 21 in the Y-axis direction are formed into a substantially perpendicular distribution.

In the graph illustrated in FIG. 7, the skirt parts of the Gaussian distribution of the distribution of the energy $E_C$ are depicted perpendicularly. However, in some cases, the graph shape of the skirt parts of a Gaussian distribution formed through blocking of the actual laser beam 21 does not form a completely perpendicular shape but form a steep shape because light travels around, or the like. That is, the substantially perpendicular shape may be a completely perpendicular shape or may be a steep shape. When light travels around from the light blocking part 33 or 43, or the like, the skirt parts of the Gaussian distribution do not form a completely perpendicular shape but form a steep shape.

As illustrated in FIG. 3, the imaging lens group 23 is composed of two or more lenses. In the imaging lens group 23, within a single focal length of one lens that contributes to imaging, another lens having operation of a composite focal length is disposed. The imaging lens group 23 may be a lens group in which the relative position between two or more lenses is fixed. The imaging lens group 23 may be mounted on a casing of the laser beam irradiation unit 20 in the state in which the relative position between two or more lenses is fixed. The imaging lens group 23 is a two-piece compound lens with a lens 231 that is a spherical biconcave lens and a lens 232 that is a biconvex lens in the embodiment. The lens 232 has a role in shortening the distance of imaging. In addition, a component of one direction of spherical surfaces has a role as a cylindrical lens.

The imaging lens group 23 forms an image of the beam shape of the laser beam 21 for which the energy distribution has been corrected by the energy distribution correcting unit 30 or 40 on the upper surface of the workpiece 100. The imaging lens group 23 can move relative to the cylindrical lens 24 along the optical axis of the laser beam 21. The imaging lens group 23 may be housed in one casing as in the embodiment or may be configured in such a manner that the imaging lens group 23 is housed in separate casings and the casings move integrally with each other. Furthermore, the imaging lens group 23 is a lens group in which the two or more lenses 231 and 232 configuring the lens group are disposed close to each other, and the two or more lenses provide operation of what is called a composite focal length.

The cylindrical lens 24 adjusts the energy density in the X-axis direction regarding the laser beam 21 for which the energy distribution has been corrected by the energy distribution correcting unit 30 or 40. Due to this, a focal spot length $L_O$ in the X-axis direction at the focal spot 27 of the laser beam 21 illustrated in FIG. 5 is changed to a focal spot length L. Only one cylindrical lens 24 is disposed on the optical path of the laser beam irradiation unit 20. Although being a plano-concave lens in the embodiment, the cylindrical lens 24 may be a plano-convex lens in the present invention.

The cylindrical lens 24 can move relative to the imaging lens group 23 along the optical path of the laser beam 21. The cylindrical lens 24 adjusts the energy density of the laser beam 21 in the X-axis direction through being moved relative to the imaging lens group 23 along the optical path of the laser beam 21. As above, the laser beam irradiation unit 20 of the laser processing apparatus 1 according to the embodiment adjusts the energy density of the laser beam 21 in the X-axis direction by moving the only one cylindrical lens 24 along the optical path of the laser beam 21. Although the cylindrical lens 24 is disposed on the rear side relative to the imaging lens group 23 in the embodiment, the imaging lens group 23 and the cylindrical lens 24 may be disposed with switching of the positional relationship between the imaging lens group 23 and the cylindrical lens 24 in the present invention.

The mirror 25 reflects the laser beam 21 and causes the laser beam 21 to travel toward the workpiece 100 held by the holding surface 11 of the chuck table 10. In the embodiment, the mirror 25 reflects the laser beam 21 that has passed through the cylindrical lens 24.

The condensing lens 26 condenses the laser beam 21 emitted from the laser oscillator 22 onto the workpiece 100 to irradiate the workpiece 100 with the laser beam 21. In the embodiment, the condensing lens 26 condenses the laser beam 21 reflected by the mirror 25. The focal length of the condensing lens 26 is 100 mm in the embodiment.

As described above, by using the imaging lens group 23 composed of the plural lenses 231 and 232 as a relay lens, the laser processing apparatus 1 according to the embodiment can cause the principal plane of the lenses 231 and 232 configuring the imaging lens group 23 to move closer to the energy distribution correcting unit 30 or 40 along the optical path. In the conventional optical system, a lens that contributes to change in the focal length, i.e. has operation of a composite focal length, is not disposed within the focal length of a lens that contributes to imaging. In contrast, in the imaging lens group 23, another lens having operation of a composite focal length is disposed within the focal length of the lens that contributes to imaging. This can shorten the distance between the energy distribution correcting unit 30 or 40 and the imaging lens group 23 and thus can contribute to reduction in the size of the apparatus.

Moreover, by incorporating a factor of a surface having the curvature of a cylindrical lens into the imaging lens group 23, the number of cylindrical lenses, which are conventionally used as a pair, can be reduced to one. Therefore, the need to adjust the generatrix is eliminated, and it becomes possible to make adjustment easy. Furthermore, the function of the composite focal length is exerted and the focal length of the relay lens can be shortened. Therefore, the movement distance of the cylindrical lens 24 can be made shorter, and thus the adjustment time can be shortened while the accuracy of the processing point of a conventional apparatus is kept.

Figure 8:
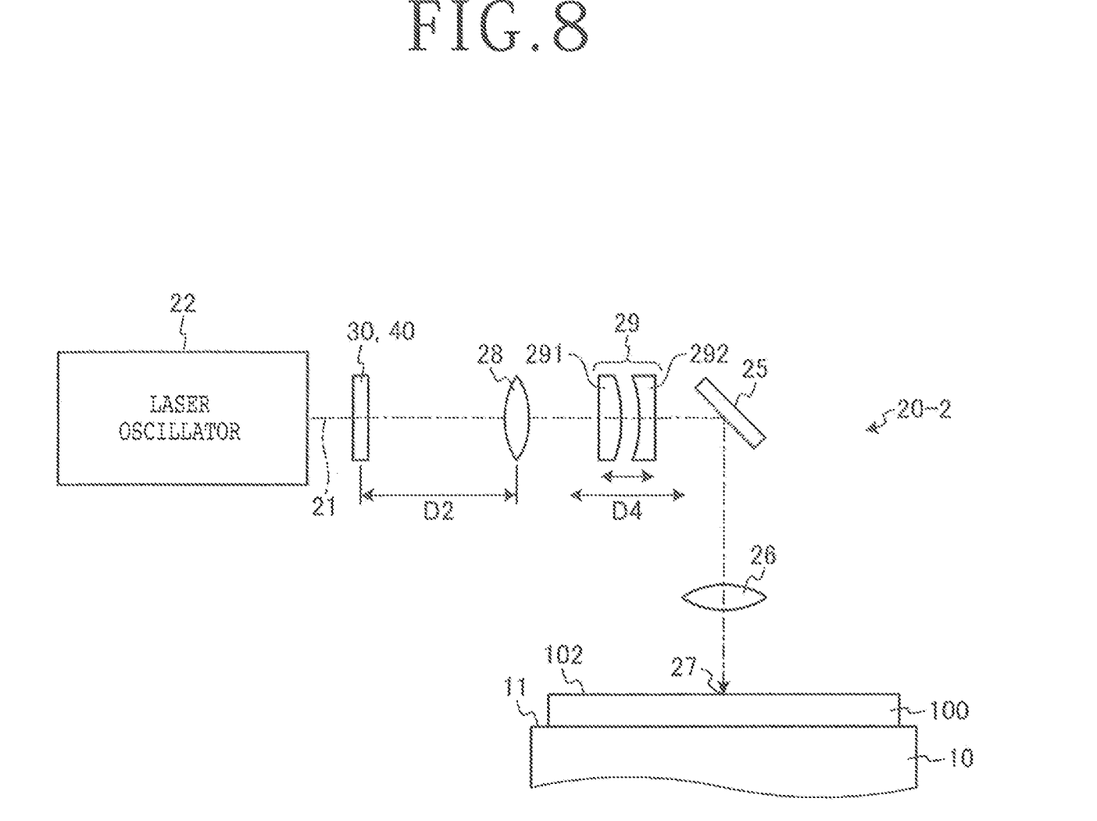
FIG. 8 is a schematic diagram schematically illustrating the configuration of a laser beam irradiation unit of a comparative example.

The inventor of the present invention has checked effects of the embodiment. For the check, comparison with a laser beam irradiation unit 20-2 of a comparative example illustrated in FIG. 8 was made. FIG. 8 is a schematic diagram schematically illustrating the configuration of the laser beam irradiation unit 20-2 of a laser processing apparatus of the comparative example. In FIG. 8, the same part as the laser beam irradiation unit 20 of the embodiment is given the same numeral and description thereof is omitted.

Compared with the laser beam irradiation unit 20 of the embodiment, the laser beam irradiation unit 20-2 of the comparative example includes a relay lens 28 and a cylindrical lens pair 29 instead of the imaging lens group 23 and the cylindrical lens 24. The relay lens 28 transfers the laser beam 21 for which the energy distribution has been corrected by the energy distribution correcting unit 30 or 40 to the cylindrical lens pair 29. The relay lens 28 is a spherical biconvex lens. The cylindrical lens pair 29 is composed of two cylindrical lenses. The cylindrical lens pair 29 is a two-piece compound lens with a cylindrical lens 291 that is a plano-convex lens and a cylindrical lens 292 that is a plano-concave lens. The two cylindrical lenses 291 and 292 configuring the cylindrical lens pair 29 can move the relative position with respect to each other. The lens 232 that is the biconvex lens of the imaging lens group 23 according to the embodiment and the relay lens 28 of the comparative example both have f=−600.

In the laser beam irradiation unit 20-2 of the comparative example, a distance D2 between the energy distribution correcting unit 30 or 40 and the relay lens 28 is 600 mm. In contrast, in the laser beam irradiation unit 20 of the embodiment, a distance D1 between the energy distribution correcting unit 30 or 40 and the imaging lens group 23 is 173 mm. Therefore, it has been revealed that the distance between the energy distribution correcting unit 30 or 40 and the imaging lens group 23 can be shortened by using the imaging lens group 23 composed of the plural lenses 231 and 232 as a relay lens.

Furthermore, in the laser beam irradiation unit 20-2 of the comparative example, a maximum movement distance D4 of the respective cylindrical lenses 291 and 292 of the cylindrical lens pair 29 for adjustment in the optical path direction is 72 mm. In contrast, in the laser beam irradiation unit 20 of the embodiment, a maximum movement distance D3 of the cylindrical lens 24 for adjustment in the optical path direction is 41 mm. Therefore, it has been revealed that the laser processing apparatus 1 can shorten the distance between the energy distribution correcting unit 30 or 40 and the imaging lens group 23 and make the movement distance of the cylindrical lens 24 shorter by using the imaging lens group 23 composed of the plural lenses 231 and 232 as a relay lens.

The present invention is not limited to the above-described embodiment. That is, the present invention can be carried out with various modifications without departing from the gist of the present invention.

Figure 9:
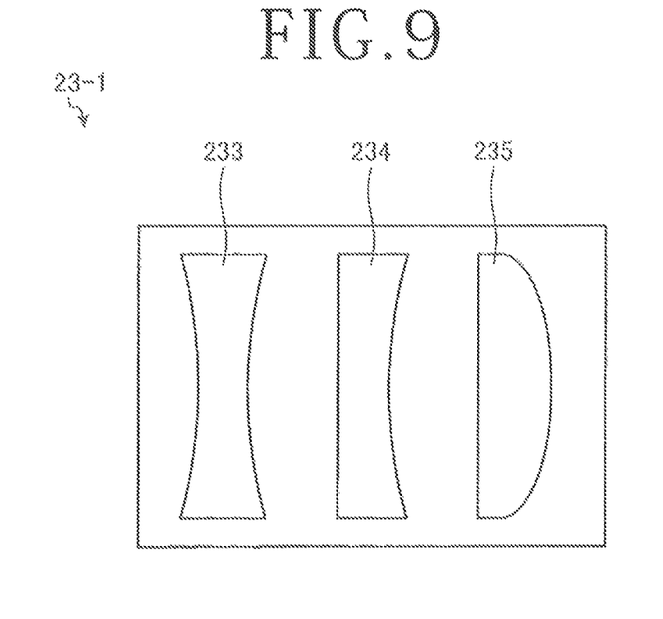
FIG. 9 is a schematic diagram illustrating the configuration of an imaging lens group according to a first modification example.

For example, the imaging lens group of the present invention is not limited to the combination of the embodiment. FIG. 9 is a schematic diagram illustrating the configuration of an imaging lens group 23-1 according to a first modification example. The imaging lens group 23-1 is a three-piece compound lens in which a lens 233 that is a spherical biconcave lens, a lens 234 that is a plano-concave lens, and a lens 235 that is a plano-convex lens sequentially line up on the optical path. The lenses 233, 234, and 235 are housed in one casing in the first modification example. The lenses 234 and 235 are disposed within the single focal length of the lens 233. The lenses 234 and 235 have operation of a composite focal length and contribute to change in the focal length.

Figure 10:
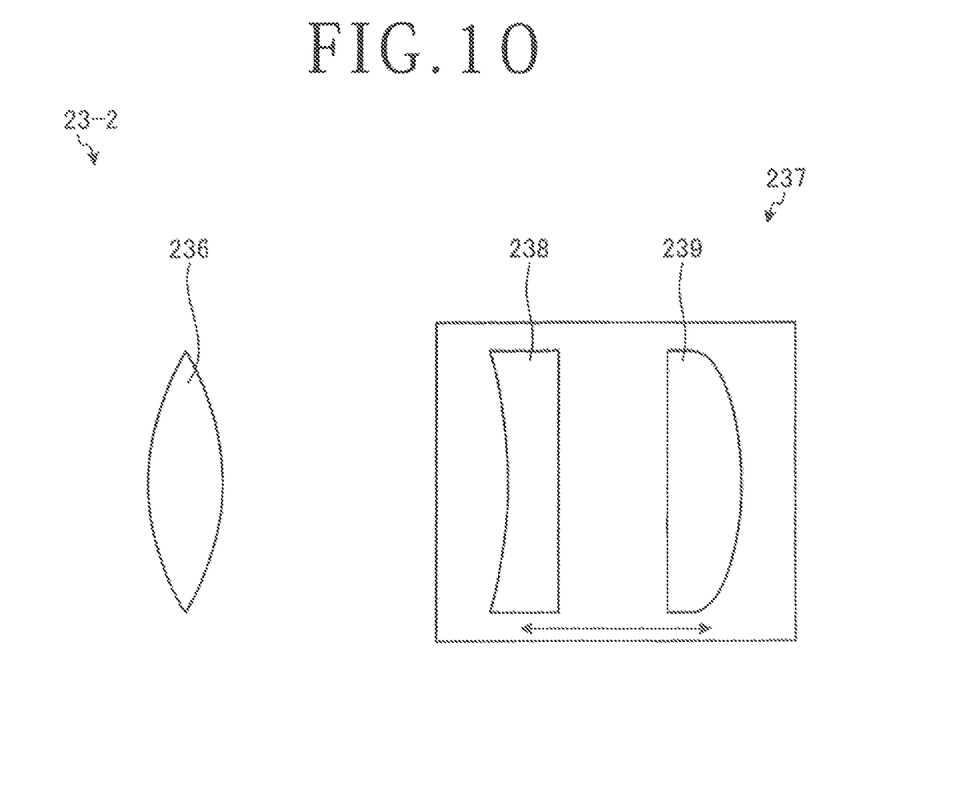
FIG. 10 is a schematic diagram illustrating the configuration of an imaging lens group according to a second modification example.

Furthermore, the imaging lens group of the present invention is not limited to a compound lens. FIG. 10 is a schematic diagram illustrating the configuration of an imaging lens group 23-2 according to a second modification example. The imaging lens group 23-2 is composed of a relay lens 236 and an expander 237. The relay lens 236 is a biconvex lens in the second modification example. The expander 237 includes a lens 238 as a plano-concave lens and a lens 239 as a plano-convex lens that can mutually adjust the distance between the lenses. The expander 237 is disposed within the single focal length of the relay lens 236. The expander 237 has operation of a composite focal length and contributes to change in the focal length.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table that holds a workpiece;
a laser beam irradiation unit that irradiates the workpiece held by the chuck table with a laser beam with a wavelength having absorbability with respect to the workpiece;
an X-axis direction movement unit that moves the chuck table and the laser beam irradiation unit relatively in an X-axis direction that is a processing feed direction; and
a Y-axis direction movement unit that moves the chuck table and the laser beam irradiation unit relatively in a Y-axis direction that is an indexing feed direction orthogonal to the processing feed direction, wherein the laser beam irradiation unit includes:
a laser oscillator,
a condensing lens that condenses the laser beam emitted from the laser oscillator,
an energy distribution correcting unit that is disposed between the laser oscillator and the condensing lens and forms skirt parts of a Gaussian distribution of an energy distribution in the Y-axis direction regarding the laser beam emitted from the laser oscillator into a perpendicular distribution,
an imaging lens group composed of two or more lenses that form an image of a beam shape of the laser beam for which the energy distribution has been corrected by the energy distribution correcting unit on an upper surface of the workpiece, wherein relative positions of the two or more lenses of the imaging lens group are fixed with respect to each other, wherein the imaging lens group includes a spherical biconcave lens, and
one cylindrical lens that adjusts energy density in the X-axis direction regarding the laser beam for which the energy distribution has been corrected by the energy distribution correcting unit,
wherein a distance between the imaging lens group and the one cylindrical lens is relatively moved to adjust a spot shape of the laser beam on the upper surface of the workpiece.

2. The laser processing apparatus according to claim 1, wherein the number of said lenses in the imaging lens group is two.

3. The laser processing apparatus according to claim 2, wherein the imaging lens group also includes a biconvex lens.

4. The laser processing apparatus according to claim 2, wherein both of said lenses in the imaging lens group are different from each other.

5. The laser processing apparatus according to claim 1, wherein at least one of the lenses of the imaging lens group is different from at least one of the other lenses of the imaging lens group.

6. The laser processing apparatus according to claim 1, wherein the imaging lens group includes a first lens contributing to imaging and having a single focal length and a second lens having operation of a composite focal length disposed in the single focal length of the first lens.

7. A laser processing apparatus comprising:
a chuck table that holds a workpiece;
a laser beam irradiation unit that irradiates the workpiece held by the chuck table with a laser beam with a wavelength having absorbability with respect to the workpiece;
an X-axis direction movement unit that moves the chuck table and the laser beam irradiation unit relatively in an X-axis direction that is a processing feed direction; and
a Y-axis direction movement unit that moves the chuck table and the laser beam irradiation unit relatively in a Y-axis direction that is an indexing feed direction orthogonal to the processing feed direction,
wherein the laser beam irradiation unit includes:
a laser oscillator,
a condensing lens that condenses the laser beam emitted from the laser oscillator,
an energy distribution correcting unit that is disposed between the laser oscillator and the condensing lens and forms skirt parts of a Gaussian distribution of an energy distribution in the Y-axis direction regarding the laser beam emitted from the laser oscillator into a perpendicular distribution,
an imaging lens group composed of two or more lenses that form an image of a beam shape of the laser beam for which the energy distribution has been corrected by the energy distribution correcting unit on an upper surface of the workpiece, and
one cylindrical lens that adjusts energy density in the X-axis direction regarding the laser beam for which the energy distribution has been corrected by the energy distribution correcting unit,
wherein a distance between the imaging lens group and the one cylindrical lens is relatively moved to adjust a spot shape of the laser beam on the upper surface of the workpiece,
wherein the imaging lens group includes a relay lens and an expander, wherein the expander comprises two lenses that are different from each other, and
wherein the expander is disposed within a single focal length of the relay lens, and the expander has operation of a composite focal length.

8. The laser processing apparatus according to claim 7, wherein the relay lens comprises a biconvex lens.

9. The laser processing apparatus according to claim 7, wherein the expander comprises a plano-concave lens and a plano-convex lens.

10. The laser processing apparatus according to claim 9, wherein the relative distance between the plano-concave lens and the plano-convex lens can be adjusted.

11. The laser processing apparatus according to claim 7, wherein:
the relay lens comprises a biconvex lens; and
the expander comprises a plano-concave lens and a plano-convex lens.

12. The laser processing apparatus according to claim 11, wherein a planar surface of the plano-concave lens and a planar surface of the plano-convex lens face each other.

13. A laser processing apparatus comprising:
a chuck table that holds a workpiece;
a laser beam irradiation unit that irradiates the workpiece held by the chuck table with a laser beam with a wavelength having absorbability with respect to the workpiece;
an X-axis direction movement unit that moves the chuck table and the laser beam irradiation unit relatively in an X-axis direction that is a processing feed direction; and
a Y-axis direction movement unit that moves the chuck table and the laser beam irradiation unit relatively in a Y-axis direction that is an indexing feed direction orthogonal to the processing feed direction,
wherein the laser beam irradiation unit includes:
a laser oscillator,
a condensing lens that condenses the laser beam emitted from the laser oscillator,
an energy distribution correcting unit that is disposed between the laser oscillator and the condensing lens and forms skirt parts of a Gaussian distribution of an energy distribution in the Y-axis direction regarding the laser beam emitted from the laser oscillator into a perpendicular distribution,
an imaging lens group composed of two or more lenses that form an image of a beam shape of the laser beam for which the energy distribution has been corrected by the energy distribution correcting unit on an upper surface of the workpiece, wherein the imaging lens group includes a spherical biconcave lens, and one cylindrical lens that adjusts energy density in the X-axis direction regarding the laser beam for which the energy distribution has been corrected by the energy distribution correcting unit, wherein a distance between the imaging lens group and the one cylindrical lens is relatively moved to adjust a spot shape of the laser beam on the upper surface of the workpiece, and wherein at least one of the lenses of the imaging lens group is different from at least one of the other lenses of the imaging lens group.

14. The laser processing apparatus according to claim 13, wherein the relative positions of all of the lenses of the imaging group are fixed with respect to each other.

15. The laser processing apparatus according to claim 13, wherein the imaging lens group also comprises a biconvex lens.

16. The laser processing apparatus according to claim 13, wherein the imaging lens group also comprises a plano-concave lens and a plano-convex lens.

17. The laser processing apparatus according to claim 16, wherein the plano-concave lens is positioned between the spherical biconcave lens and the plano-convex lens.

18. The laser processing apparatus according to claim 13, wherein the imaging lens group includes a first lens contributing to imaging and having a single focal length and a second lens having operation of a composite focal length disposed in the single focal length of the first lens.

19. A laser processing apparatus comprising:
a chuck table that holds a workpiece;
a laser beam irradiation unit that irradiates the workpiece held by the chuck table with a laser beam with a wavelength having absorbability with respect to the workpiece;
an X-axis direction movement unit that moves the chuck table and the laser beam irradiation unit relatively in an X-axis direction that is a processing feed direction; and
a Y-axis direction movement unit that moves the chuck table and the laser beam irradiation unit relatively in a Y-axis direction that is an indexing feed direction orthogonal to the processing feed direction, wherein the laser beam irradiation unit includes:
a laser oscillator,
a condensing lens that condenses the laser beam emitted from the laser oscillator,
an energy distribution correcting unit that is disposed between the laser oscillator and the condensing lens and forms skirt parts of a Gaussian distribution of an energy distribution in the Y-axis direction regarding the laser beam emitted from the laser oscillator into a perpendicular distribution,
an imaging lens group composed of two or more lenses that form an image of a beam shape of the laser beam for which the energy distribution has been corrected by the energy distribution correcting unit on an upper surface of the workpiece, the imaging lens group including a first lens contributing to imaging and having a single focal length and a second lens having operation of a composite focal length disposed in the single focal length of the first lens, and
one cylindrical lens that adjusts energy density in the X-axis direction regarding the laser beam for which the energy distribution has been corrected by the energy distribution correcting unit, wherein a distance between the imaging lens group and the one cylindrical lens is relatively moved to adjust a spot shape of the laser beam on the upper surface of the workpiece.

\* \* \* \* \*